(12) United States Patent
Morrow et al.

(10) Patent No.: US 7,193,545 B2
(45) Date of Patent: Mar. 20, 2007

(54) DIFFERENTIAL FRONT-END CONTINUOUS-TIME SIGMA-DELTA ADC USING CHOPPER STABILIZATION

(75) Inventors: Paul John Morrow, Limerick (IE); Maria del Mar Chamarro Marti, Valencia (ES); Colin G. Lyden, Cork (IE); Mike Dominic Keane, Limerick (IE); Robert W. Adams, Acton, MA (US); Richard Thomas O'Brien, Limerick (IE); Paschal Thomas Minogue, Limerick (IE); Hans Johan Olaf Mansson, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/228,113

(22) Filed: Sep. 16, 2005

(65) Prior Publication Data

US 2006/0139192 A1    Jun. 29, 2006

Related U.S. Application Data

(60) Provisional application No. 60/650,354, filed on Feb. 4, 2005, provisional application No. 60/610,742, filed on Sep. 17, 2004.

(51) Int. Cl.
*H03M 3/00* (2006.01)

(52) U.S. Cl. .................. 341/143; 341/161

(58) Field of Classification Search ............ 341/143, 341/161
See application file for complete search history.

(56) References Cited

U.S. PATENT DOCUMENTS

| | | | |
|---|---|---|---|
| 5,079,550 A | | 1/1992 | Sooch et al. |
| 6,404,367 B1 | | 6/2002 | Van der Zwan et al. |
| 6,486,820 B1 * | | 11/2002 | Allworth et al. .......... 341/161 |
| 6,577,185 B1 * | | 6/2003 | Chandler et al. .............. 330/9 |
| 6,753,801 B2 * | | 6/2004 | Rossi ....................... 341/161 |
| 6,870,495 B1 * | | 3/2005 | Zadeh et al. ............... 341/161 |
| 6,909,394 B2 * | | 6/2005 | Doerrer et al. ............. 341/200 |
| 6,927,717 B1 * | | 8/2005 | Oprescu ..................... 341/143 |
| 2001/0022555 A1 * | | 9/2001 | Lee et al. ................... 341/143 |
| 2004/0145504 A1 * | | 7/2004 | Doerrer et al. ............. 341/143 |
| 2005/0275575 A1 * | | 12/2005 | Motz .......................... 341/143 |
| 2006/0017595 A1 * | | 1/2006 | Van Veldhoven et al. .. 341/143 |

OTHER PUBLICATIONS

PCT/US2005/033450 International Search Report, Jan. 2006.
Morrow, Paul et al, "A 0.18/spl mu/m 102dB-SNR mixed CT SC audio-band/spl Delta spl Sigma/ADC", Solid-State Circuits Conference, 2005, IEEE, Feb. 6, 2005, pp. 178-179, 592.
Van der Zwan, E.J. et al, "A 0.2 mW CMOS/spl Sigma spl Delta/ modulator for speech coding with 80 dB dynamic range", Solid-State Circuits Conference, 1996, IEEE, Feb. 8, 1996, pp. 232-233,451.

* cited by examiner

*Primary Examiner*—Rexford Barnie
*Assistant Examiner*—Joseph Lauture
(74) *Attorney, Agent, or Firm*—Wolf, Greenfield & Sacks, P.C.

(57) ABSTRACT

A multi-bit continuous-time sigma-delta analog-to-digital converter (ADC) has a differential input stage which receives an analog input signal current. A multi-bit feedback current digital-to-analog converter (IDAC) generates a multi-level feedback current depending on a digital feedback signal from a flash ADC. An integrator has a differential input that integrates the difference of the generated current by the multi-bit IDAC and the input signal current on a continuous-time basis. The input stage further comprises a first biasing current source and a second biasing current source which bias the input stage in a mid-scale condition. A first summing node connects to the first differential input line, a first differential input of the integrator and the first output branch. A second summing node connects to the second differential input line, a second differential input of the integrator and the second output branch. A set of chopping switches alternately connect the biasing current sources to the summing nodes in a first configuration and a second, reversed, configuration. The converter receives a modulator clock signal at a frequency $F_S$ and the chopping switches can operate at $F_S$ or a binary subdivision thereof. The integrator amplifier can also be chopper-stabilized.

12 Claims, 6 Drawing Sheets

DIFFERENTIAL FRONT-END CONTINUOUS-TIME SIGMA-DELTA ADC USING CHOPPER STABILIZATION

FIELD OF THE INVENTION

This invention relates to continuous-time sigma-delta analog-to-digital converters.

BACKGROUND TO THE INVENTION

The sigma-delta (ΣΔ) architecture has become the most popular architecture for realizing high-resolution analog-to-digital converters (ADC). FIG. 1 illustrates a generalized topology as used in a sigma delta analog-to-digital converter (ADC). The integrator stages 15, 16, 17 depicted in FIG. 1 can use continuous-time (C/T or CT) digital-to-analog converters (DACs) or discrete-time (D/T or DT) DACs. The continuous-time solution incorporates a current DAC (IDAC) in the feedback path, whereas a discrete-time solution incorporates a switched-capacitor (S/C) DAC in the feedback path.

Continuous-time Sigma Delta ADCs have received much attention in the last couple of years for applications that require signal bandwidths of several MHz. Continuous-time ADCs are more favourable over switched-capacitor ADCs due to their lower power requirements. Other advantages include better noise immunity due to their inherent anti-aliasing properties, which is especially advantageous in RF receivers. Also, the technology trend towards very deep submicron processes dictates lower power supply voltages. Switched capacitor based circuits require boot-strapping techniques to drive the switches in order to extend the dynamic range and sampling rates of the converter. Continuous-time ADCs avoid such problems and much higher signal bandwidths can be attained.

Despite the advantages mentioned above in using continuous-time ΣΔ ADCs, audio band ADC implementations have remained in the discrete time domain. This is because discrete time ADCs achieve relatively high linearity, they are very tolerant of clock jitter, and as high signal bandwidths are not required moderate sampling rates can be employed in sigma-delta based ADCs. Also, chopper stabilisation can be readily employed in discrete-time to remove the flicker noise especially problematic in deep submicron MOS devices and the filter coefficients are very stable. The paper "A 114-dB 68-mW Chopper-stabilized stereo multibit audio ADC in 5.62 mm$^2$", by YuQing Yang; Chokhawala, A.; Alexander, M.; Melanson, J.; Hester, D.; IEEE Journal of Solid-State Circuits, Vol. 38, Issue 12, Dec. 2003 Pages 2061–2068 describes the use of chopping in conjunction with a multi-bit discrete-time ADC. However, chopper stabilization is restricted to the op-amp used for the integrator stage.

U.S. Pat. No. 5,039,989 (Welland et al.) uses chopping in conjunction with a continuous-time converter, but only with a single-bit ADC and single-bit feedback-DAC solution. Single-bit continuous-time ADCs are especially sensitive to jitter and the arrangement presented in U.S. Pat. No. 5,039, 989 is unsuitable for a multi-bit converter.

A discrete-time ADC implementation would seem to be advantageous over a continuous-time ADC for audio band applications for the reasons mentioned already. However, relatively large signal ranges, used within audio television are outside the voltage range that switched-capacitor based circuits implemented in deep sub-micron technology can easily interface to. In this case, the only solution would be to attenuate the input signal and thus surrender valuable dynamic range. Even after attenuating the input signal, anti-alias filtering circuitry and buffering circuitry would be required to drive the switched-capacitor input stage. OEMs typically demand that this functionality is provided on-chip, inevitably leading to an increased die cost along with deteriorated noise performance.

There is a desire to use a continuous-time front-end ΣΔ modulator in this application as it avoids having to attenuate, anti-alias filter and buffer the input. However, in using a continuous-time front-end ΣΔ ADC there remain issues of the continuous-time ΣΔ modulator being sensitive to clock jitter and distortion which is produced as a result of the inter-symbol interference within the IDAC. The technology trend towards very deep sub-micron processes dictates lower power supply voltages. Continuous-time ADCs are well suited to these processes. However, one limitation which has inhibited the use of continuous-time ADCs is flicker noise. Implementing a Continuous-time ADC in sub-micron technology would require the DC biasing current source to have a large area in order to achieve low noise. This is because flicker noise is inversely proportional to the area of a device. The input and output devices of the amplifiers would also require a large area for achieving high performance. However, a lower area solution would be desirable.

Accordingly, the present invention seeks to provide an improved continuous-time sigma-delta ADC.

SUMMARY OF THE INVENTION

A multi-bit continuous-time sigma-delta analog-to-digital converter (ADC) has an input stage with a first and a second differential input line which receive an analog input signal current. A multi-bit feedback current digital-to-analog converter (IDAC) generates a multi-level feedback current depending on a feedback signal. Typically, the feedback signal is generated by a Flash ADC positioned downstream of the input stage. The IDAC has a first output branch and a second output branch. An integrator has a differential input that integrates the difference of the generated current by the multi-bit IDAC and the input signal current on a continuous-time basis. The input stage further comprises a first biasing current source and a second biasing current source which bias the input stage in a mid-scale condition. A first summing node connects to a first differential input line, the first differential input of the integrator and the first output branch. A second summing node connects to a second differential input line, the second differential input of the integrator and the second output branch. A set of chopping switches alternately connect the biasing current sources to the summing nodes in a first configuration and a second configuration. In the first configuration the first biasing current source connects to the first summing node and the second biasing current source connects to the second summing node. In the second configuration the first biasing current source connects to the second summing node and the second biasing current source connects to the first summing node. The converter receives a modulator clock signal at a frequency $F_S$ and the chopping switches can operate at $F_S$ or a binary subdivision thereof.

Chopping the flicker noise present within the input stage circuitry allows higher noise performance ADCs to be implemented in small sub-micron technologies and reduces the overall size of the converter when implemented in an integrated circuit. This is because flicker noise is inversely proportional to area of a device. Where the multi-bit IDAC comprises a set of unit IDACs, the feedback signal can be arranged such that it selects various combinations of the unit IDACs on a random or pseudo-random basis to achieve a given level of feedback current. The random/pseudo-random selection can be performed by a scrambler which operates on the feedback signals passed between the Flash ADC and IDAC.

Additional improvements in noise performance can be obtained by chopper-stabilizing the integrator amplifier. Preferably the integrator amplifier comprises two gain stages and only the first gain stage is chopper-stabilized.

Multi-bit continuous-time ADCs are advantageous over switched-capacitor based solutions in large mixed-signal integrated circuits (chips) since they are less sensitive to substrate noise. Other advantages include: there is lower thermal noise since aliasing does not occur; external interfacing is made easier since there are no discrete pockets of charge required from the input; and larger input signal ranges are possible since the headroom/footroom of a switch is not an obstacle. Employing a multi-bit current DAC alleviates the clock jitter sensitivity experienced by single-bit CT ADCs. Employing a multi-bit architecture also alleviates the slew rate requirement of the integrator amplifier.

BRIEF DESCRIPTION OF THE DRAWINGS

Embodiments of the invention will be described with reference to the accompanying drawings in which.

DESCRIPTION OF PREFERRED EMBODIMENTS

Figure 1:
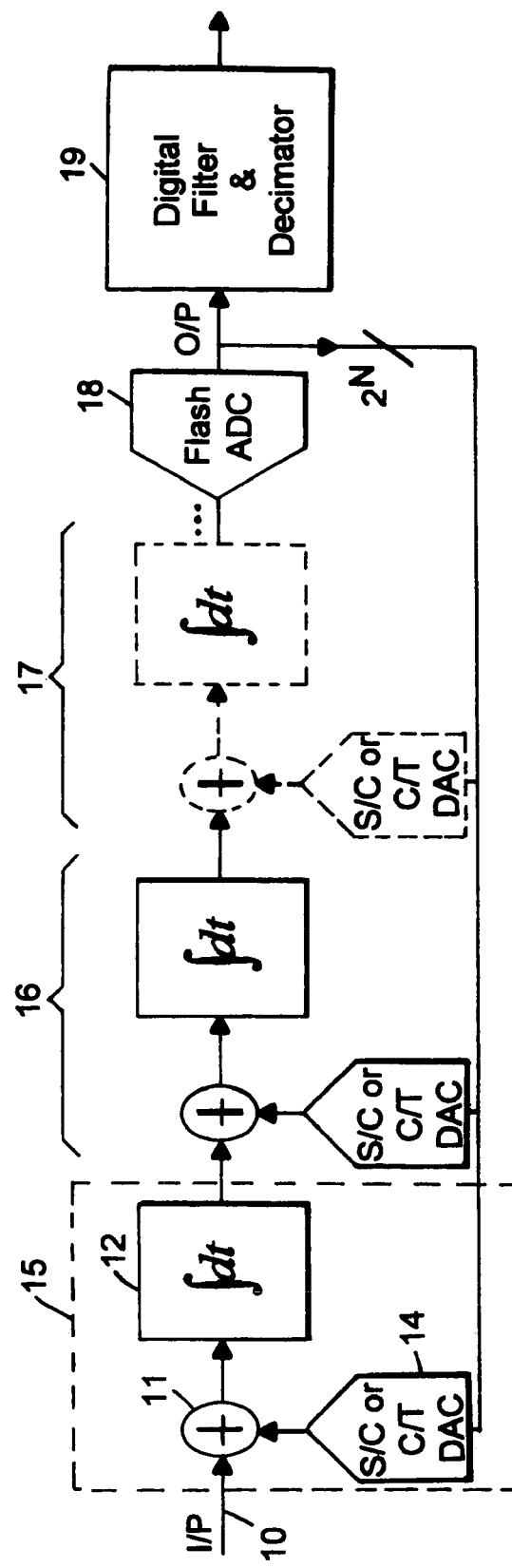
FIG. 1 schematically shows a multi-bit sigma delta ADC.

The present invention will be described with respect to particular embodiments and with reference to certain drawings but the invention is not limited thereto but only by the claims. The drawings described are only schematic and are non-limiting.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. Furthermore, the terms first, second, third and the like in the description and in the claims, are used for distinguishing between similar elements and not necessarily for describing a sequential or chronological order.

Figure 2:
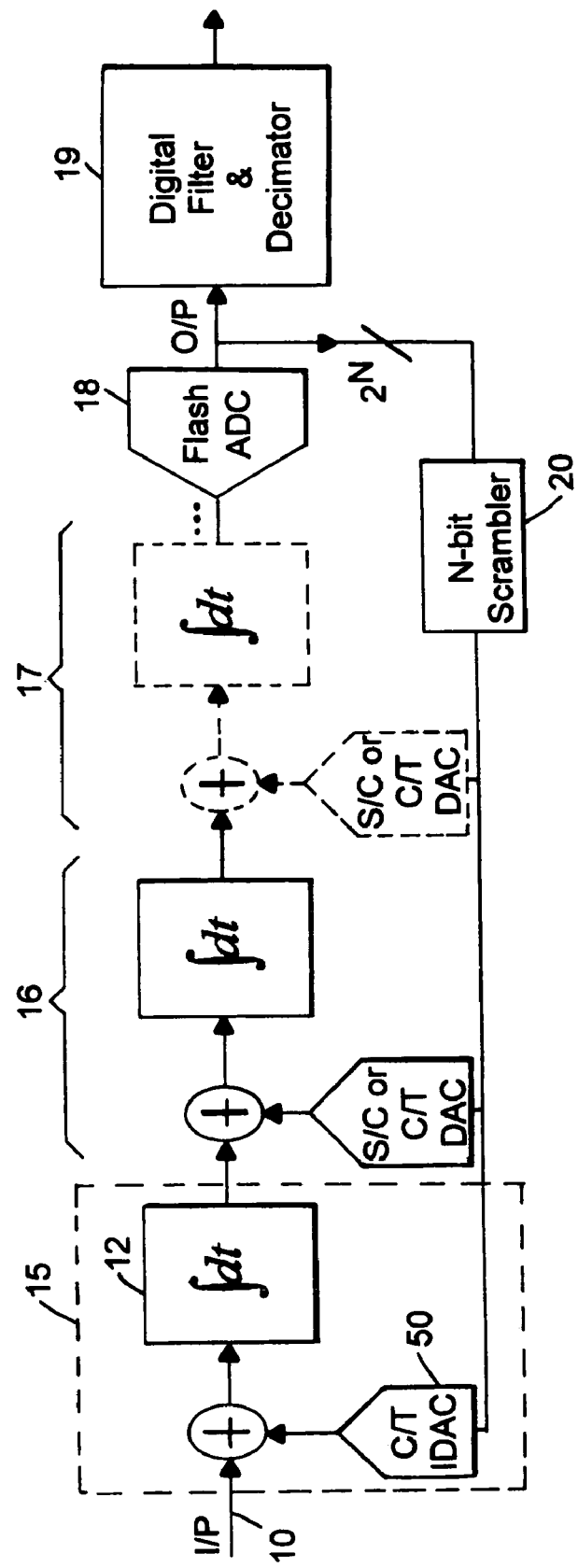
FIG. 2 schematically shows a multi-bit sigma delta ADC in accordance with an embodiment of the invention.

FIG. 2 illustrates a topology that combines chopping, multi-bit and continuous-time operation in one sigma-delta ADC. The first stage integrator 15 is a continuous-time (CT) variety and a multi-bit current DAC (IDAC) 150 is used to generate a multi-level current and to perform the subtraction from the incoming input signal current (I/P). Employing a multi-bit current DAC 150 alleviates the clock jitter sensitivity experienced by single-bit CT ADCs. Employing a multi-bit architecture also alleviates the slew rate requirement of the amplifier used to implement integrator stage 12. The subsequent integrator stages 16, 17 following the first stage 15 can be continuous-time or discrete-time. A Flash ADC 18 converts the output of the last integrator stage 17 into a multi-bit digital code which is fed back to the DACs within stages 15, 16, 17. The digital code has one of $2^N+1$ values. A digital filter and decimator 19 converts the output into a digital code having a desired resolution.

As will be described in more detail below, the IDAC 150 comprises a set of unit IDACs, i.e. a set of IDACs which each have the same value current source. For an N bit Flash ADC, the IDAC 150 in input stage 15 comprises a set of $2^N$ unit IDACs and there are $2^N$ thermometer coded digital lines in the feedback path, one for each unit IDAC. The feedback signal from the Flash ADC 18 is fed to a scrambler 20. The mismatch of the unit elements in the IDAC is noise-shaped by the scrambler 20 employed in the feedback path. Stated another way, for a given value of feedback signal, the scrambler will vary the selection of unit IDACs to achieve that level of feedback signal. The use of the scrambler to select different combinations of IDACs in the continuous time stage has been found to have a chopping effect on flicker noise. For low level input signals, the output codes from the scrambler provide a spectrum that inherently chops (modulates) the current source flicker noise to a high frequency that is later removed by the digital decimation filter 19. The scrambler operates at the same clock rate as the modulator clock rate.

Figure 3:
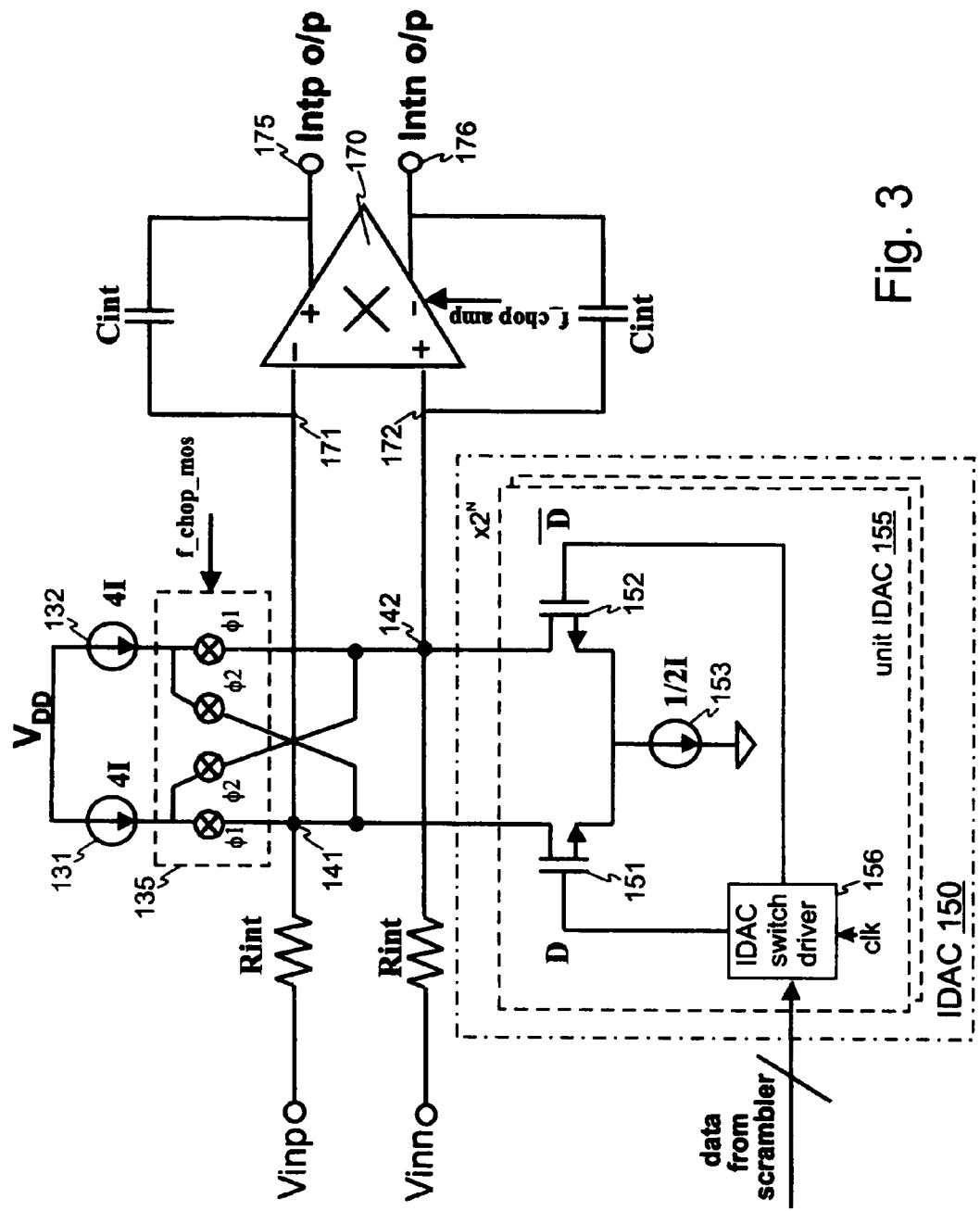
FIG. 3 shows a differential front-end for use in the converter of FIG. 2.

A front-end of an ADC according to an embodiment of the invention is shown in FIG. 3. This corresponds to stage 15 of the overall ADC shown in FIG. 2. The front-end has a pair of differential inputs Vinp, Vinn and a pair of differential outputs Intp 175 and Intn 176. Typically, a differential input signal will connect to Vinp, Vinn via a dc decoupling capacitor (not shown). Each input Vinp, Vinn is connected in series with a resistor Rint. The front-end comprises two DC biasing current sources 131, 132 which each supply a bias current. The bias current is used to bias the front-end in a mid-scale condition in the absence of an analog input signal. A first current source 131 is connected between a supply rail $V_{DD}$ and a summing node 141 via chopping switches 135. A second current source 132 is connected between the supply rail $V_{DD}$ and a summing node 142 via chopping switches 135. A multi-bit current digital-to-analog converter (IDAC) 150 is connected to the nodes 141, 142. The IDAC comprises a set of $2^N$ unit IDACs, one of which is shown in detail as 155 in FIG. 3. The IDAC receives a multi-bit digital feedback signal from a Flash ADC (18, FIG. 2) which is used to select a number of the unit value IDACs 155. Each unit IDAC 155 comprises a current source 153. A first end of the current source 153 is connected to ground. A first branch of each IDAC 155 is connected between the second end of the current source 153 and summing node 141 via a switch 151. A second branch of each IDAC 155 is connected between the second end of the current source 153 and summing node 142 via a switch 152. Each IDAC 155 receives a selection signal which is applied to an IDAC switch driver 156. The switch driver 156 generates a D and a D bar selection signal, with the D signal being applied to switch 151 and the D bar signal being applied to switch 152. In this manner, the branches of the IDAC are differentially driven. Switch driver 156 responds to a clock signal, as will be more fully described below, which switches the outputs (D, D bar) in a symmetrical manner.

A set of chopping switches 135 alternately connect the biasing current sources 131, 132 to the nodes 141, 142 in a first configuration and a second configuration. In a first configuration, biasing current source 131 connects to node 141 and biasing current source 132 connects to node 142 (as previously described). In this configuration the switches φ1 are closed and switches φ2 are open. In a second configuration, the current sources are swapped around, with biasing current source 131 connecting to node 142 and biasing current source 132 connecting to node 141. In this configuration the switches φ2 are closed and the switches φ1 are open. The chopping switches 135 receive a clock signal f_chop_mos which controls the switching rate of the switches 135. The chopping switches 135 can operate at the same rate ($F_S$) as the main clock for the sigma-delta modulator or at binary subdivisions of the modulator clock rate, e.g. $F_S/2$, $F_S/4$, $F_S/8$.

An integrator stage comprises an integrator amplifier (op-amp) 170 with a feedback capacitor Cint connected between each output and input pair. Summing node 141 connects to the inverting input terminal 171 of integrator amplifier 170. Summing node 142 connects to the non-inverting input terminal 172 of integrator amplifier 170. The integrator amplifier 170 is chopper-stabilized and receives a signal f_chop amp which controls the rate of chopping.

The operation of the circuit will now be described. Three sources of flicker noise in the front-end are the unit current sources 153 within each IDAC 155, the bias current sources 131, 132 and the flicker noise present in the integrator amplifier 170. Chopping the bias current sources 131, 132 by alternately connecting them to the summing nodes 141, 142 in one configuration and then a reversed configuration has the effect of modulating their flicker noise to the frequency at which they are switched back and forth. This noise is also modulated to odd harmonics of this switching rate i.e. Fs, 3Fs, 5Fs etc. The current sources 153 present within the IDAC are switched back and forth by the switching action of the scrambler 20. The differential amplifier 170 contains two sets of chopping switches that alternately switch back and forth. This causes the flicker noise present within the amplifier 170 to be shifted to the frequency of the clock that drives the chopping switches and to its associated odd harmonics. The chopping switches within the amplifier 170 can operate at the same rate ($F_S$) as the main clock for the sigma-delta modulator or at binary subdivisions of the modulator clock rate, e.g. $F_S/2$, $F_S/4$, $F_S/8$.

When an IDAC is selected, current source 153 is connected to summing node 141 via switch 151 and pulls current from node 141. Conversely, when an IDAC is not selected switch 152 in the second branch is turned on which connects current source 153 to summing node 142. This has the effect of pulling current from node 142. Differential amplifier 170 in conjunction with the integrating capacitors Cint integrates the difference of the net input current at nodes 171, 172 and generates a differential output voltage between outputs Intp 175 and Intn 176.

Noise from the current source 153 within each IDAC 155 is chopped by the pseudo-random selection of IDACs by scrambler 20 (shown in FIG. 2). The switching properties of the scrambler 20 employed in the feedback path of the multi-bit ADC allows chopping to be accomplished without the need to explicitly employ chopping switches and high-frequency clocks. Explicit chopping switches and a clock of sufficiently high frequency are required to chop the flicker noise of the DC biasing current sources 131, 132.

Figure 4:
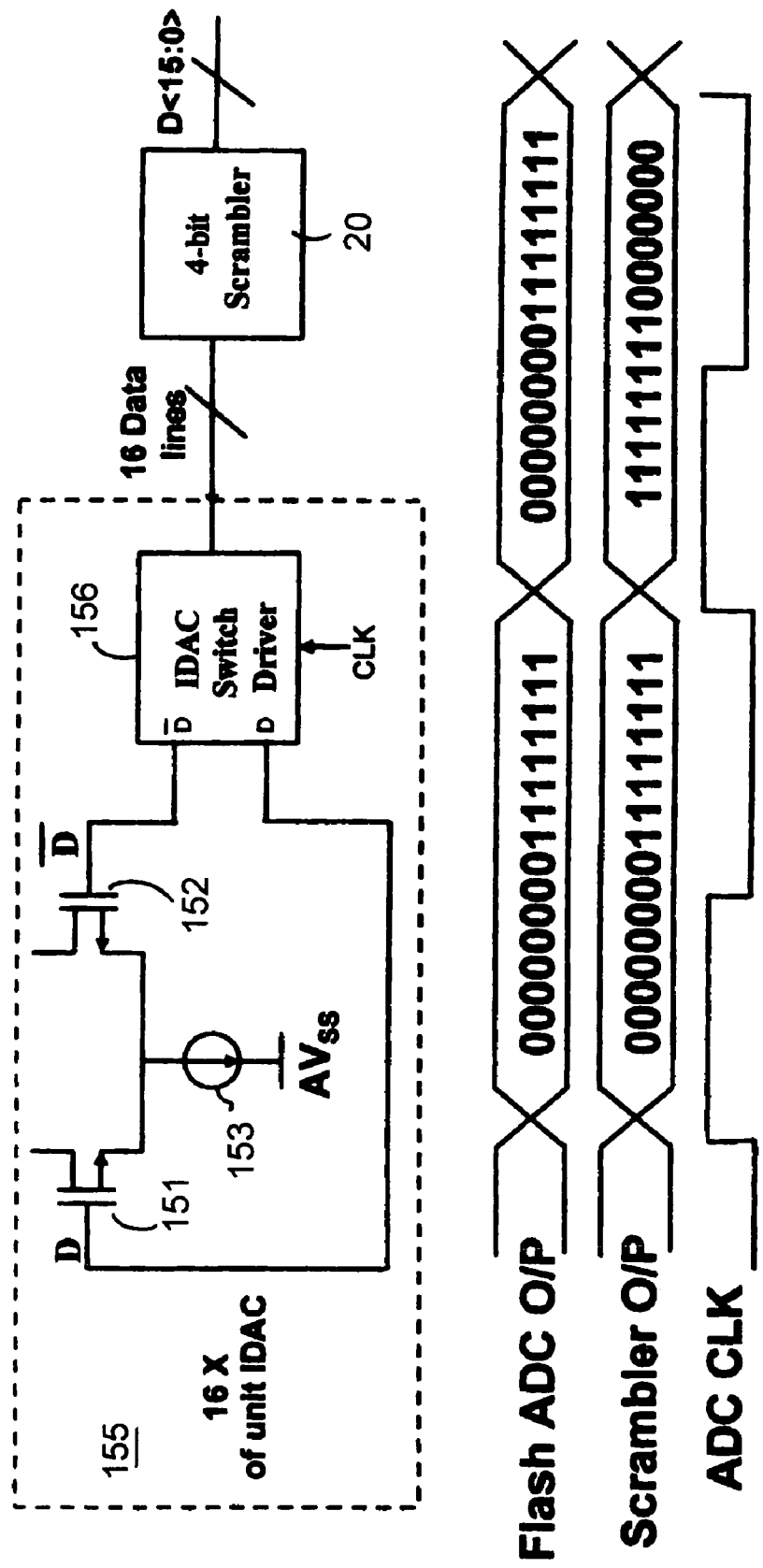
FIG. 4 shows operation of the scrambler used in the ADC of FIG. 2.

FIG. 4 shows operation of the scrambler 20 previously shown in FIG. 2. Each unit IDAC 155 is driven by a data bit. The data is thermometer coded so that in this example of a 4 bit IDAC there are $2^4=16$ data lines, one data line for each unit IDAC 155, which can take a value in the range 0–16. A data-directed scrambler 20 selects combinations of IDAC unit elements on a pseudo-random basis. The integrator stage 170 integrates the output on a continuous basis. FIG. 4 shows an example situation where the required feedback value is 8. This requires eight of the unit IDACs 155 to have their current steered through switch 151 whilst the other eight have their current steered through switch 152. Rather than selecting the same set of eight IDACs on each occasion, the scrambler selects a different combination of IDACs on a pseudo-random basis to achieve the desired feedback current. In the simplest case, this selects the set of IDACs '0000000011111111' on a first cycle and the set of IDACs '1111111100000000' on a second cycle. The scrambler can, of course, select other combinations of IDACs to achieve a value of 8. The use of the scrambler 20 to select different combinations of IDACs has been found to have a chopping effect on flicker noise. For low level input signals, the output codes from the scrambler provide a spectrum that inherently chops the current source flicker noise to a high frequency that is later removed by filtering.

Figure 5:
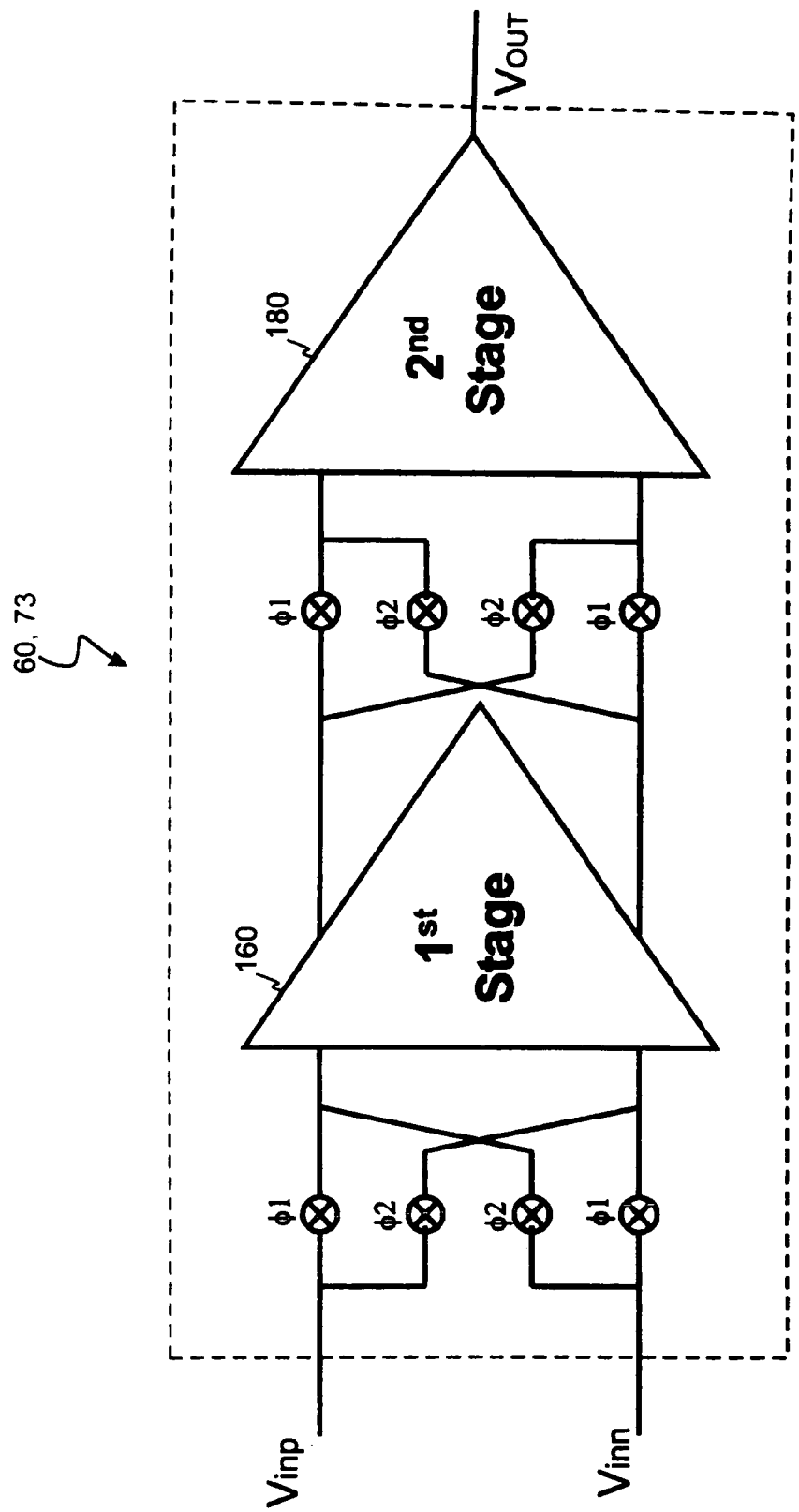
FIG. 5 schematically shows the two-stage chopper-stabilized amplifier used within the front-end of FIG. 3; and, FIG. 6 shows the two-stage amplifier of FIG. 5 in more detail.
Figure 6:
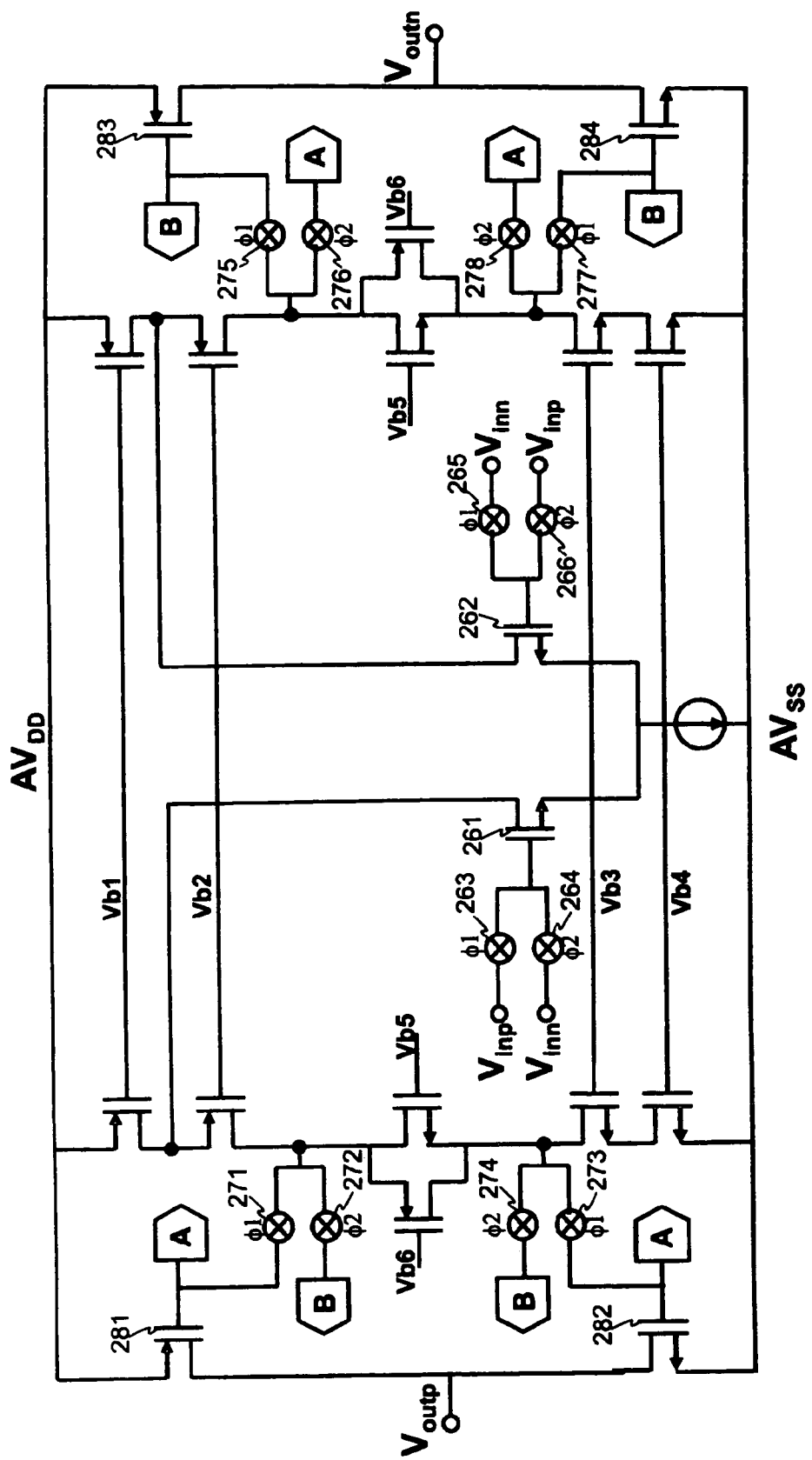

FIG. 5 shows, in schematic form, a chopper-stabilized fully differential amplifier which can be used as the amplifier 170 of the integrator stage. The amplifier has two gain stages 260, 280. The amplifier has inputs Vinp, Vinn and outputs Voutp, Voutn. FIG. 6 shows one way of realising amplifier 170. The first gain stage receives a pair of differential inputs Vinp, Vinn and comprises devices 261, 262 which are loaded by a folded cascode stack of devices. The polarity of the input pair within the amplifier varies during each of the two cycles of operation, with switches φ1 being closed and switches φ2 open during the first cycle, and switches φ1 being open and switches φ2 closed during the second cycle. This has the effect of swapping the inputs and outputs of the first stage 260 between alternative clock cycles. It can be seen that during a first cycle Vinp is connected to the gate of device 261 via switch 263 and Vinn is connected to the gate of device 262 via switch 265. During a second cycle Vinn is connected to the gate of device 261 via switch 264 and Vinp is connected to the gate of device 262 via switch 266. The overall polarity of the amplifier is unchanged as a result of the chopping switches 271–278 at the output of the first gain stage. The second gain stage comprises devices 281–284 are provides outputs Voutp, Voutn. The use of an amplifier having two gain stages, with chopper stabilization only of the first gain stage, has been found to provide a performance advantage in a continuous time ADC circuit.

This architecture retains the advantages of a low-area ADC while also providing high performance. The differential structure of FIG. 3 also allows even harmonic cancellation from the distortion produced by the switching of the current sources themselves.

The invention is not limited to the embodiments described herein, which may be modified or varied without departing from the scope of the invention.

The invention claimed is:

1. A multi-bit continuous-time sigma-delta analog-to-digital converter (ADC) with an input stage comprising:
   a first and a second differential input line which are operable to receive an analog input signal current;
   a multi-bit feedback current digital-to-analog converter (IDAC) which is operable to generate a multi-level feedback current depending on a feedback signal, said multi-bit IDAC having a first output branch and a second output branch and comprising a set of individual IDACs, each having a current source which is selectably connectable to the first output branch and the second output branch;

an integrator having a first and a second differential input which is operable to integrate a difference of the current generated by the multi-bit IDAC and the input signal current on a continuous-time basis;

a first biasing current source and a second biasing current source which are operable to bias the input stage in a mid-scale condition;

a first summing node which connects to the first differential input line, the first differential input of the integrator and the first output branch;

a second summing node which connects to the second differential input line, the second differential input of the integrator and the second output branch; and, a set of chopping switches which are operable to alternately connect the biasing current sources to the summing nodes in a first configuration, in which the first biasing current source connects to the first summing node and the second biasing current source connects to the second summing node and a second configuration, in which the first biasing current source connects to the second summing node and the second biasing current source connects to the first summing node.

2. A converter according to claim 1 which is operable to receive a modulator clock signal at a frequency $F_s$ and wherein the chopping switches operate at $F_s$ or a binary subdivision thereof.

3. A converter according to claim 1 wherein the individual IDACs are unit value IDACs.

4. A converter according to claim 1 wherein the feedback signal individually selects each individual IDAC, the current source within each individual IDAC being connectable to one of the first output branch and the second output branch.

5. A converter according to claim 4 further comprising an ADC stage, downstream of the input stage, which is operable to generate the feedback signal and a scrambler which is operable to act on the feedback signal to vary the selection of individual IDACs to achieve each level of feedback current.

6. A converter according to claim 1 wherein the integrator comprises an amplifier and the integrator amplifier is chopper-stabilized.

7. A converter according to claim 6 wherein the integrator amplifier comprises two gain stages and wherein only the first gain stage is chopper-stabilized.

8. A converter according to claim 6 which receives a modulator clock signal at a frequency $F_s$ and wherein a set of chopping switches within the chopper-stabilized amplifier operate at $F_s$ or a binary subdivision thereof.

9. A converter according to claim 1 in the form of an integrated circuit.

10. A method of using a multi-bit feedback current digital-to-analog converter (IDAC) to generate a signal using a multi-bit continuous-time sigma-delta analog-to-digital converter (ADC) comprising:

providing a differential input signal current across a first input line and a second differential input line;

generating a multi-bit feedback current on two output branches, the feedback current varying according to a received feedback signal and the IDAC comprising a set of individual IDACs, each having a current source which is selectably connectable to the first output branch and the second output branch;

integrating a difference of the current generated by the multi-bit IDAC and the input signal current on a continuous-time basis;

providing a first biasing current and a second biasing current; and alternately connecting the biasing current sources to the output branches in a first configuration and a second, reversed, configuration.

11. A method according to claim 10 wherein the converter is operable to receive a modulator clock signal at a frequency Fs and wherein the step of alternately connecting the biasing current sources to the output branches operates at $F_s$ or a binary subdivision thereof.

12. A signal resulting from a method of using a multi-bit feedback current digital-to-analog converter (IDAC) to generate a signal using a multi-bit continuous-time sigma-delta analog-to-digital converter (ADC) comprising:

providing a differential input signal current across a first input line and a second differential input line;

generating a multi-bit feedback current on two output branches, the feedback current varying according to a received feedback signal and the IDAC comprising a set of individual IDACs, each having a current source which is selectably connectable to the first output branch and the second output branch;

integrating a difference of the current generated by the multi-bit IDAC and the input signal current on a continuous-time basis;

providing a first biasing current and a second biasing current; and alternately connecting the biasing current sources to the output branches in a first configuration and a second, reversed, configuration.

* * * * *